United States Patent
Kudo

(10) Patent No.: US 7,698,613 B2
(45) Date of Patent: Apr. 13, 2010

(54) SEMICONDUCTOR INTEGRATED CIRCUIT DEVICE AND METHOD OF TESTING SAME

(75) Inventor: Kazuya Kudo, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 608 days.

(21) Appl. No.: 11/683,954

(22) Filed: Mar. 8, 2007

(65) Prior Publication Data

US 2007/0226565 A1    Sep. 27, 2007

(30) Foreign Application Priority Data

Mar. 14, 2006  (JP) .............................. 2006-069371

(51) Int. Cl.
    *G01R 31/28* (2006.01)
(52) U.S. Cl. ........................ 714/731; 714/744
(58) Field of Classification Search .................. 326/38; 365/201; 714/726, 727, 729, 731, 744
    See application file for complete search history.

(56) References Cited

U.S. PATENT DOCUMENTS

| | | | | |
|---|---|---|---|---|
| 6,400,625 | B2 * | 6/2002 | Arimoto et al. | 365/201 |
| 6,442,722 | B1 | 8/2002 | Nadeau-Dostie et al. | |
| 6,671,848 | B1 * | 12/2003 | Mulig et al. | 714/744 |
| 6,785,173 | B2 * | 8/2004 | Sohn et al. | 365/201 |
| 6,861,867 | B2 * | 3/2005 | West et al. | 326/38 |
| 7,058,868 | B2 * | 6/2006 | Guettaf | 714/727 |
| 7,089,471 | B2 * | 8/2006 | Guettaf | 714/731 |
| 7,500,165 | B2 * | 3/2009 | Guettaf | 714/731 |
| 7,558,997 | B2 * | 7/2009 | Noda | 714/726 |

FOREIGN PATENT DOCUMENTS

| | | | |
|---|---|---|---|
| JP | 2003-513286 A | 4/2003 | |
| JP | 2005-223171 A | 8/2005 | |

* cited by examiner

*Primary Examiner*—David Ton
(74) *Attorney, Agent, or Firm*—Sughrue Mion, PLLC

(57) ABSTRACT

Disclosed is a circuit in which for conducting the scan path test, test clock terminals are provided in a number smaller than that of user clock domains, and a test clock control circuits on respective test clock lines to control whether the pulses of the test clock are propagated or blocked.

19 Claims, 11 Drawing Sheets

SEMICONDUCTOR INTEGRATED CIRCUIT DEVICE AND METHOD OF TESTING SAME

FIELD OF THE INVENTION

This invention relates to a semiconductor integrated circuit and, more particularly, to a semiconductor integrated circuit device and a method of testing the device.

BACKGROUND OF THE INVENTION

A scan path test is available as a technique (DFT) for facilitating detection of faults in a semiconductor integrated circuit. In a case where operating frequencies differ for respective ones of a plurality of clock domains that exist in user mode, there are instances where a speed test is conducted for each individual clock domain. In order to perform fault analysis when a failure occurs in a specific clock domain, a scan path test is conducted for each individual clock domain. Here "user mode" is an operational mode and is used to distinguish it from the scan path test mode that is set when a scan path test is executed. It signifies an operational mode in which the internal functions of a semiconductor integrated circuit operate as usual at times other than when the scan path test mode is in effect. Although it can also be referred to as "normal mode", the term "user mode" will be employed in the description that follows. Further, an operational clock supplied at the time of operation in the user mode will be referred to as a "user clock" in order to distinguish it from a test clock supplied at the time of the scan path test, and a terminal at which the user clock is supplied will be referred to as a "user clock terminal".

In a large-scale semiconductor integrated circuit having a large number of terminals, use is made of a scan path test that involves providing test clock terminals the number of which is the same as or approximately the same as the number of individual clock domain in user mode, and controlling each of the clock domains individually.

On the other hand, in the case of a small-scale semiconductor integrated circuit with a small number of terminals or a semiconductor integrated circuit the number of test terminals of which is limited for the purpose of multiple parallel testing, a test structure that employs fewer test clock terminals is sought. There is also a need to avoid, to the extent possible, an increase in additional circuits for testing.

Patent Document 1 discloses a method of testing a circuit, which has two or more clock domains, at respective domain test clock rates and under the control of a main test clock. FIG. 1 illustrates the arrangement disclosed in Patent Document 1. This circuit has core logic 26 and a plurality of scannable memory elements each having a clock input, an input connected to an output of the core logic 26 and/or an output connected to an input to the core logic 26. The dashed line represents the boundary between two clock domains. The circuit is configurable in the scan path test mode in which memory elements 20, 22, 28, 30 are connected to define one or more scan chains in each domain, and in the user mode in which the memory elements are connected to the core logic in normal operational mode. The method comprises configuring the memory elements in the scan path test mode and simultaneously clocking a test signal into each scan chain of each clock domain. With regard to each clock domain having a domain test clock signal synchronous with respect to the main test clock signal, clocking includes clocking the test signal at a shift clock rate derived from the main test clock signal and, with regard to each clock domain having a domain test clock signal which is asynchronous with respect to the main test clock signal, clocking all but a predetermined number of bits of the test signal at a first domain shift clock rate derived from the main test clock signal followed by clocking the predetermined number of bits of the test signal at a second domain shift clock rate corresponding to the domain test clock rate. The method further includes configuring the memory elements of each scan chain in the user mode in which the memory elements of each scan chain are interconnected by the core logic in the normal operational mode; clocking each memory element in each scan chain at its respective domain test clock rate for at least one clock cycle; configuring the memory elements in the scan path test mode; and clocking a test response pattern out of each of the scan chains at its respective domain shift clock rate during a respective scan-out interval. All respective scan-out intervals overlap in time for a plurality of clock cycles at the highest of the respective clock rates.

Further, Patent Document 2 discloses a scan chain connecting method (see FIG. 2) for preventing wiring congestion when all scan chains are configured by connecting groups in a semiconductor integrated circuit in which a plurality of scan chain groups have been configured. Shown in FIG. 2 are an input/output cell area 101, scan chain groups 102 to 110, a scan input cell 111, a scan output cell 112 and centroids 113 to 121 of respective scan chain groups. In this scan chain connecting method of configuring all scan chains by connecting scan chain groups after scan chains have been connected in individual scan chain groups, the sequence in which scan chain groups are connected together is decided based upon a prescribed evaluation relating to layout position information of cells concerning the respective clock systems of the scan chain groups. In accordance with this method, it is possible to decide a sequence for connecting scan chain groups together, so as to shorten the connection wiring between scan chains, based upon a prescribed evaluation of layout position information of cells concerning the clock systems within the scan chain groups. This makes it possible to prevent wiring congestion when configuring scan chains in the overall semiconductor integrated circuit. On the basis of the prescribed evaluation, the sequence for connecting scan chain groups is in order of decreasing mutual distance between centroid coordinates of all flip-flop layout positions included in respective scan chain groups; in order of decreasing mutual distance between coordinate positions of gated cells present in a clock group system of a scan chain; or in order of decreasing mutual distance between coordinate positions of any pre-designated marked cells in a clock system of a scan chain group. Alternatively, on the basis of the prescribed evaluation, sets of flip-flops having the shortest mutual distance in position coordinates between different scan chain groups are decided upon as flip-flop candidates for connecting scan chains, and the sequence for connecting scan chain groups is in order of decreasing mutual distance between flip-flop candidates for connecting scan chains.

[Patent Document 1] Japanese Patent Kohyo Publication No. JP-P2003-513286A

[Patent Document 2] Japanese Patent Kokai Publication No. JP-P2005-223171A

Patent Document 1 discloses a test circuit and test method which, when a scan path test is conducted, are for individually controlling a plurality of clock domains having different test clock rates and testing the plurality of clock domains simultaneously. In the system according to Patent Document 1, each of a plurality of clock domains having different test clock rates can be tested, and the plurality of clock domains can be tested simultaneously. However, with regard to the state of internal logic that has been stored in the scannable memory elements (scanned flip-flops), the result of compression by an MISR (result compression circuit) in a BIST controller is observed from an external terminal in the scan-out interval (i.e., in the scan shift operation). Consequently, it is very difficult to specify fault location in a case where the fault exists in the internal logic. Furthermore, since the result is compressed and output by the MISR, a circuit configuration in which the state of the internal logic is indeterminate is not allowed. Accordingly, a problem which arises is that it is necessary to add on a test circuit for the purpose of avoiding undefined circumstances.

Further, in the system according to Patent Document 1, a BIST function is used as an arrangement that controls a plurality of clock domains having different test clock rates. As a result, it is necessary to add on large-scale circuitry such as an auxiliary controller and BIST controller. This invites a major increase in the circuit area of a small-scale semiconductor integrated circuit. It is difficult, therefore, to actually employ Patent Document 1.

The system of Patent Document 2, on the other hand, illustrates a method of preventing wiring congestion when all scan chains are configured by connecting groups in a semiconductor integrated circuit in which a plurality of scan chain groups have been configured. In order to deal with a limitation in the number of scan chains that can be implemented in a semiconductor integrated circuit, this is a technique that reduces the wiring congestion of all scan chains by constructing a scan chain for every individual clock group system and then taking the physical positional relationship of flip-flops, etc., in the layout into consideration when deciding the sequence for connecting clock groups in which the scan chains have been constructed. However, the number of scan path test clock terminals separately required in a case where a scan path test is conducted cannot be reduced.

This causes an increase in the number of terminals of the semiconductor integrated circuit. Problems which arise are an increase in the chip cost of the semiconductor integrated circuit; an increase in the area of the mounting chip occupied, which is attendant upon an increase in package size; and a decline in test efficiency and an increase in test cost owing to a limitation in quantity at the time of parallel testing for testing a plurality of circuits simultaneously by an LSI tester.

SUMMARY OF THE DISCLOSURE

Accordingly, the present invention disclosed in this application seeks to solve the problems mentioned above and has the structure set forth below.

The present invention has a structure in which clock gating cells are inserted between a plurality of user clock terminals and a plurality of clock domains (user clock domains) corresponding to user clocks supplied from the respective user clock terminals, and makes it possible to control the pertinent clock gating outputs. More specifically, the present invention has test clock control circuits, which control whether test clock signals are propagated or blocked, and which are respectively provided on respective ones of a plurality of clock signal supply paths that supply respective clock signals to a plurality of register groups, and at least one test clock terminal, the number of which is less than the number of user clock domains; wherein at the time of a scan path test, a test clock signal from the test clock terminal is controlled by respective ones of the test clock control circuits on the plurality of clock signal supply paths, and a scan path test relating to each of the register groups on the plurality of clock signal supply paths is conducted.

A semiconductor integrated circuit device according to one aspect of the present invention has a plurality of sets of a clock signal supply path and a register group comprising a plurality of scan flip-flops driven in common by a clock signal from the clock signal supply path; a test clock control circuit being provided on each clock signal supply path; wherein when a user mode is in effect, each test clock control circuit allows a user clock signal, which is supplied from a corresponding user clock terminal, to propagate to the corresponding clock signal supply path; when a scan path test mode is in effect, each test clock supply circuit, in a scan-shift interval, allows a test clock signal supplied from a common scan clock terminal to propagate to the corresponding clock signal supply path and scan-shifts a respective one of the plurality of sets of register groups; in a scan-capture interval, a selected clock signal supply path is supplied with a test clock pulse from the corresponding test clock control circuit, a capture operation is performed selectively with respect to a register group connected to the selected clock signal supply path, and no test clock pulse is supplied to a non-selected clock signal supply path; and a scan path test relating to each register group of the plurality of clock signal supply paths is made executable with a number of test clock terminals smaller than the number of clock signal supply paths.

In the present invention, the test clock control circuit has a scan flip-flop and a clock gating circuit which controls whether a test clock pulse is propagated or blocked, based upon the scan flip-flop.

In the present invention, the scan flip-flop within the test clock control circuit is scan-chain connected with a scan flip-flop in another test clock control circuit.

In the present invention, the scan flip-flop within the test clock control circuit may be chain-connected with another scan flip-flop on the corresponding clock signal supply path.

In the present invention, a value for controlling the clock gating circuit in the scan-capture interval is set in the scan flip-flop within the test clock control circuit by the final value of a scan-shift operation.

In the present invention, the clock gating circuit in the test clock control circuit is controlled by a logic gate which receives an output value from the scan flip-flop.

In the present invention, n-number of the test clock control circuits are provided in correspondence with the number (n) of user clock domains; first to (n−1)th of the test clock control circuits each have a scan flip-flop and a clock gating circuit which controls whether a test clock pulse is propagated or blocked, based upon the scan flip-flop; and the nth test clock control circuit has a clock gating circuit which receives outputs from the scan flip-flops of the first to (n−1)th of the test clock control circuits and controls, based upon a combination of values of the outputs, whether a test clock pulse is propagated or blocked.

In the present invention, the test clock control circuit has a clock selection circuit provided downstream of the clock gating circuit, the clock selection circuit receiving as an input a control signal that controls the scan path test mode and the user mode, selecting and outputting the user clock signal when the control signal indicates the user mode and selecting and outputting the test clock signal when the control signal indicates the scan path test mode; wherein the signal selected by the clock selection circuit is supplied to the clock signal supply path.

In the present invention, the test clock control circuit has a clock selection circuit provided upstream of the scan flip-flop, the clock selection circuit receiving as an input a control signal that controls the scan path test mode and the user mode, selecting the user clock signal when the control signal indicates the user mode and selecting the test clock signal when the control signal indicates the scan path test mode.

A semiconductor integrated circuit device according to the present invention comprises: first to nth user clock terminals for receiving respective ones of a plurality (n) of user clock signals; a test clock terminal for receiving at least one test clock signal; a first control signal input terminal for receiving a first control signal for controlling a scan path test mode and a user mode; a second control signal input terminal for receiving a second control signal for controlling changeover between a scan-shift operational mode and a scan-capture operational mode; a scan input terminal; first to (n+1)th scan output terminals; and first to nth test clock control circuits connected between the respective first to nth user clock terminals and respective first to nth test clock supply paths to first to nth groups of scan flip-flops.

Each test clock control circuit receives as inputs the first and second control signals, the test clock signal from the test clock terminal and the user clock signal from the corresponding user clock terminal, and includes: a scan flip-flop which, when the scan path test mode is in effect, and based upon the second control signal, samples and outputs serial data from the scan input terminal in response to the test clock signal in a scan-shift interval, and samples a signal at a data input terminal in a scan-capture interval; a clock gating circuit for controlling transmission and non-transmission of the test clock signal based upon result of a logical operation between the output of the scan flip-flop and the second control signal; and a clock selection circuit receiving the first control signal as a selection control signal, selecting the user clock signal when the first control signal indicates the user mode (non-scan path test mode) and selecting the output of the clock gating circuit when the first control signal indicates the scan path test mode. The outputs of the clock selection circuits of the first to nth test clock control circuits are supplied to respective first to nth test clock supply paths; a signal from the scan input terminal is supplied to the scan flip-flop in the first test clock control circuit; the scan flip-flop in an ith (where i is an integer equal to or greater than 2 and less than n) test clock control circuit is supplied with a signal from the scan output terminal of the scan flip-flop of the immediately preceding test clock control circuit; the output of the scan flip-flop in the nth test clock control circuit is connected to the first scan output terminal; and scan outputs of the first to nth groups of scan flip-flops are connected to the second to (n+1) th scan output terminals.

A semiconductor integrated circuit device according to another aspect of the present invention comprises: first to nth user clock terminals for receiving respective ones of a plurality (n) of user clock signals; a test clock terminal for receiving at least one test clock signal; a first control signal input terminal for receiving a first control signal for controlling a scan path test mode and a user mode; a second control signal input terminal for receiving a second control signal for controlling changeover between a scan-shift operational mode and a scan-capture operational mode; a scan input terminal; first to (n+1)th scan output terminals; and first to nth test clock control circuits connected between the respective first to nth user clock terminals and respective first to nth test clock supply paths to first to nth groups of scan flip-flops.

Each of the first to (n−1)th test clock control circuits receives as inputs the first and second control signals, the test clock signal from said test clock terminal and the user clock signal from the corresponding user clock terminal, and includes: a scan flip-flop which, when the scan path test mode is in effect, and based upon the second control signal, samples and outputs serial data from said scan input terminal in response to the test clock signal in a scan-shift interval, and samples a signal at a data input terminal in response to the input test clock signal in a scan-capture interval; a clock gating circuit for controlling transmission and non-transmission of the test clock signal based upon result of a logical operation between the output of the scan flip-flop and the second control signal; and a clock selection circuit receiving the first control signal as a selection signal, selecting the user clock signal when the first control signal indicates the user mode (non-scan path test mode) and selecting the output of the clock gating circuit when the first control signal indicates the scan path test mode.

The nth test clock control circuit receives as inputs the first and second control signals, the test clock signal from the test clock terminal and the user clock signal from the corresponding user clock terminal, and includes: a decoder circuit which receives each of the outputs of the scan flip-flops of the first to (n−1)th test clock control circuits, and generates a signal, which conforms to a combination of the outputs of the scan flip-flops, in the scan-capture interval; a clock gating circuit for controlling transmission and non-transmission of the test clock signal based upon an output from the decoder circuit; and a clock selection circuit receiving the first control signal as a selection signal, selecting the user clock signal when the first control signal indicates the user mode and selecting the output of the clock gating circuit when the first control signal indicates the scan path test mode. The outputs of the clock selection circuits of the first to nth test clock control circuits are supplied to respective first to nth test clock supply paths; a signal from the scan input terminal is supplied to the scan flip-flop in the first test clock control circuit; the scan flip-flop in an ith (where i is an integer equal to or greater than 2 and less than n) test clock control circuit is supplied with a signal from the scan output terminal of the scan flip-flop of the immediately preceding test clock control circuit; the output of the scan flip-flop in the nth test clock control circuit is connected to the first scan output terminal; and scan outputs of the first to nth groups of scan flip-flops are connected to the second to (n+1)th scan output terminals.

In a semiconductor integrated circuit device according to another aspect of the present invention, each test clock control circuit receives as inputs the first and second control signals, the test clock signal from said test clock terminal and the user clock signal from the corresponding user clock terminal, and includes: a clock selection circuit for selecting the user clock when the first control signal indicates the user mode and selecting the output of the clock gating circuit when the first control signal indicates the scan path test mode; a scan flip-flop which, when the first control signal indicates the user mode, is set to a prescribed value, and which, based upon the second control signal, samples and outputs serial data from the scan input terminal in response to the test clock signal in a scan-shift interval, and samples a signal at a data input terminal in response to the test clock signal in a scan-capture interval; and a clock gating circuit for controlling transmission and non-transmission of the clock signal, which is output from the clock selection circuit, based upon result of a logical operation between the output of the scan flip-flop and the second control signal. The outputs of the clock selection circuits of the first to nth test clock control circuits are supplied to respective first to nth test clock supply paths; a signal from the scan input terminal is supplied to the scan flip-flop of the first test clock control circuit; the scan flip-flop in an ith (where i is an integer equal to or greater than 2 and less than n) test clock control circuit is supplied with a signal from the scan output terminal of the scan flip-flop of the immediately preceding test clock control circuit; the output of the scan flip-flop in the nth test clock control circuit is connected to the first scan output terminal; and scan outputs of the first to nth groups of scan flip-flops are connected to second to (n+1)th scan output terminals.

In the present invention, the output of the scan flip-flop in the test clock control circuit is connected to the scan output terminal of each test clock control circuit and to the clock gating circuit in each test clock control circuit and is fed back and input to the data input terminal of the scan flip-flop.

In the present invention, the scan flip-flop in the test clock control circuit is set to a prescribed value when the first control signal indicates the non-scan-path mode (the user mode).

In the present invention, a control signal for resetting or setting the scan flip-flop is input, and the scan flip-flops of the first to nth test clock control circuits are set to a prescribed value by the control signal for resetting or setting.

In the present invention, at least one output of the scan flip-flop of the nth test clock control circuit is scanned into the corresponding scan flip-flop group.

In accordance with another aspect of the present invention, there is provided a method of testing a semiconductor integrated circuit device having a plurality of sets composed of a clock signal supply path and a register group comprising a plurality of scan flip-flops driven in common by a clock signal from the clock signal supply path, the method comprising the steps of: providing a test clock control circuit on each clock signal supply path; when a scan path test mode is in effect, each test clock supply circuit, in a scan-shift interval, allowing a test clock signal supplied from a common scan clock terminal to propagate to the corresponding clock signal supply path and scan-shifting a respective one of the plurality of sets of register groups; in a scan-capture interval, supplying a selected clock signal supply path with a test clock pulse from the corresponding test clock control circuit, performing a capture operation with respect to a register group connected to the selected clock signal supply path, and supplying no test clock pulse to a non-selected clock signal supply path; and executing a scan path test relating to each register group of the plurality of clock signal supply paths, with a number of test clock terminals smaller than the number of clock signal supply paths.

In the present invention, the test clock control circuit has a scan flip-flop and a clock gating circuit which controls whether a test clock pulse is propagated or blocked, based upon the scan flip-flop.

In the present invention, a value for controlling the clock gating circuit in the scan-capture interval is set in the scan flip-flop within the test clock control circuit by the final value of a scan-shift operation. In the present invention, it may be so arranged that the scan flip-flop of the test clock control circuit is connected to the clock gating cell, and the scan flip-flop is further chain-connected with the scan flip-flops on other scan chains.

The meritorious effects of the present invention are summarized as follows.

In accordance with the present invention, any value is set as the final value of a scan-shift operation in a scan flip-flop connected to a clock gating cell and to a scan chain, thereby making it possible to control the propagation of a test clock in a capture interval of a scan path test. This makes it possible a scan path test for every user clock domain.

Still other features and advantages of the present invention will become readily apparent to those skilled in this art from the following detailed description in conjunction with the accompanying drawings wherein embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

EXEMPLARY EXAMPLES OF THE INVENTION

Figure 1:
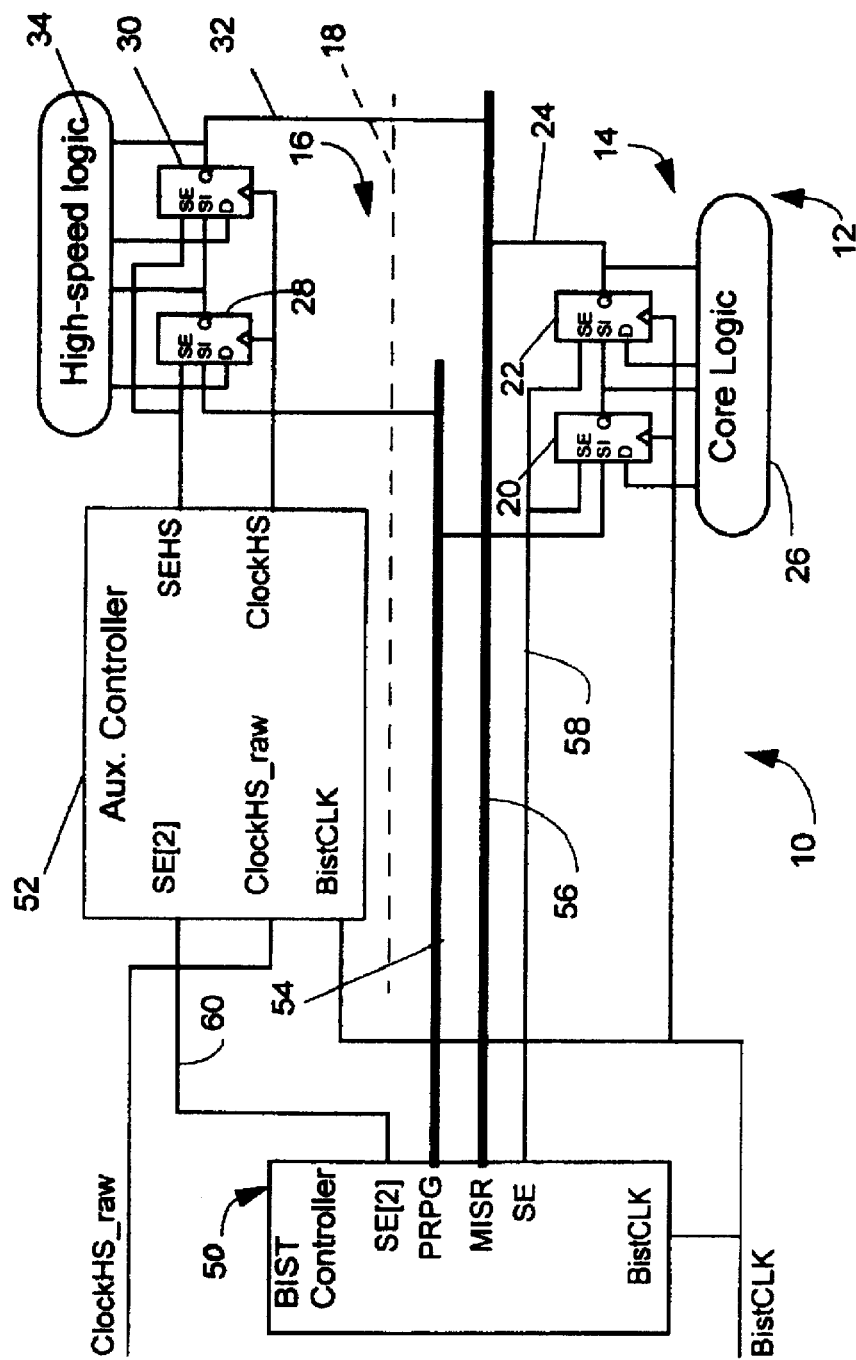
FIG. 1 illustrates the structure of Patent Document 1.
Figure 2:
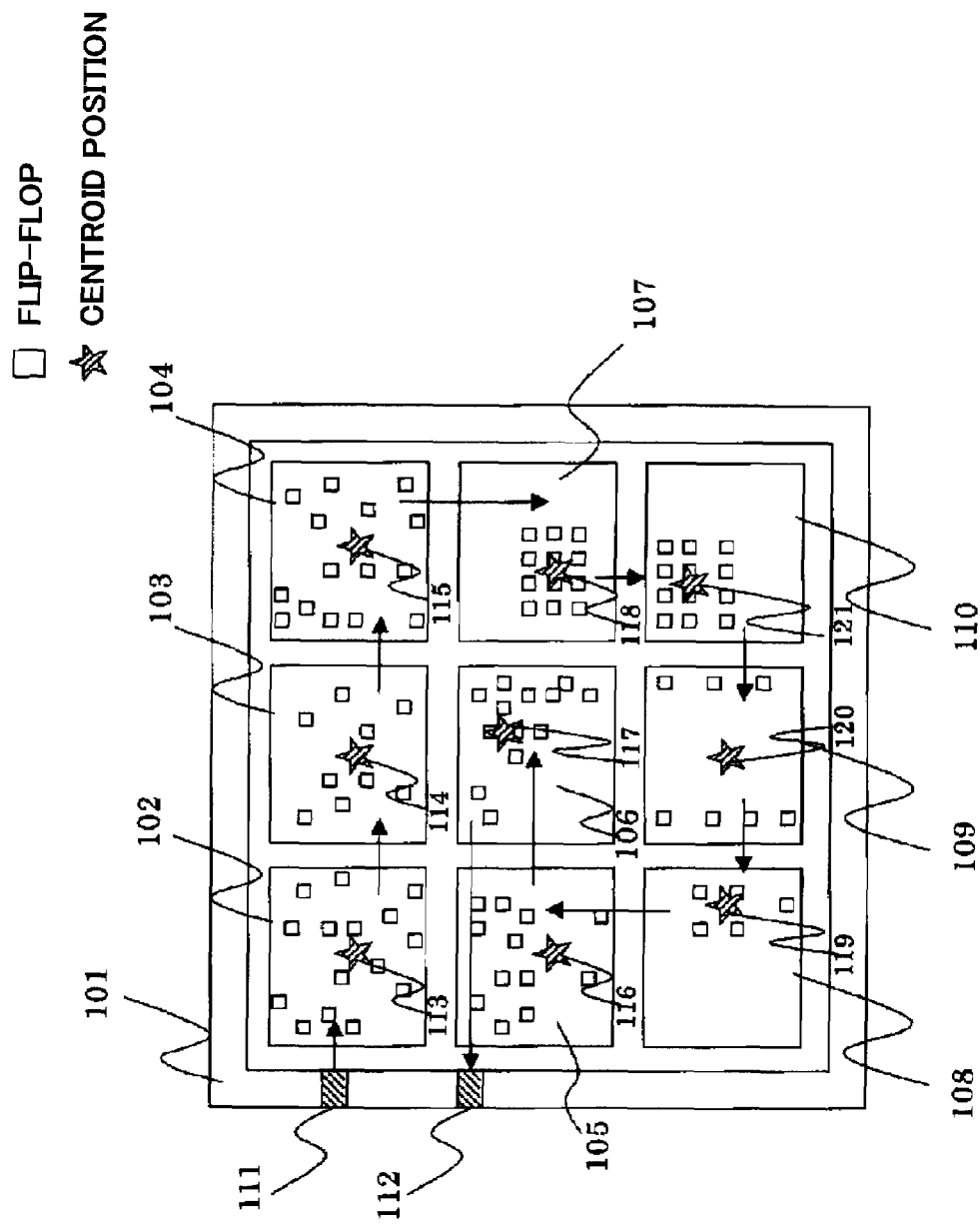
FIG. 2 illustrates the structure of Patent Document 2.
Figure 3:
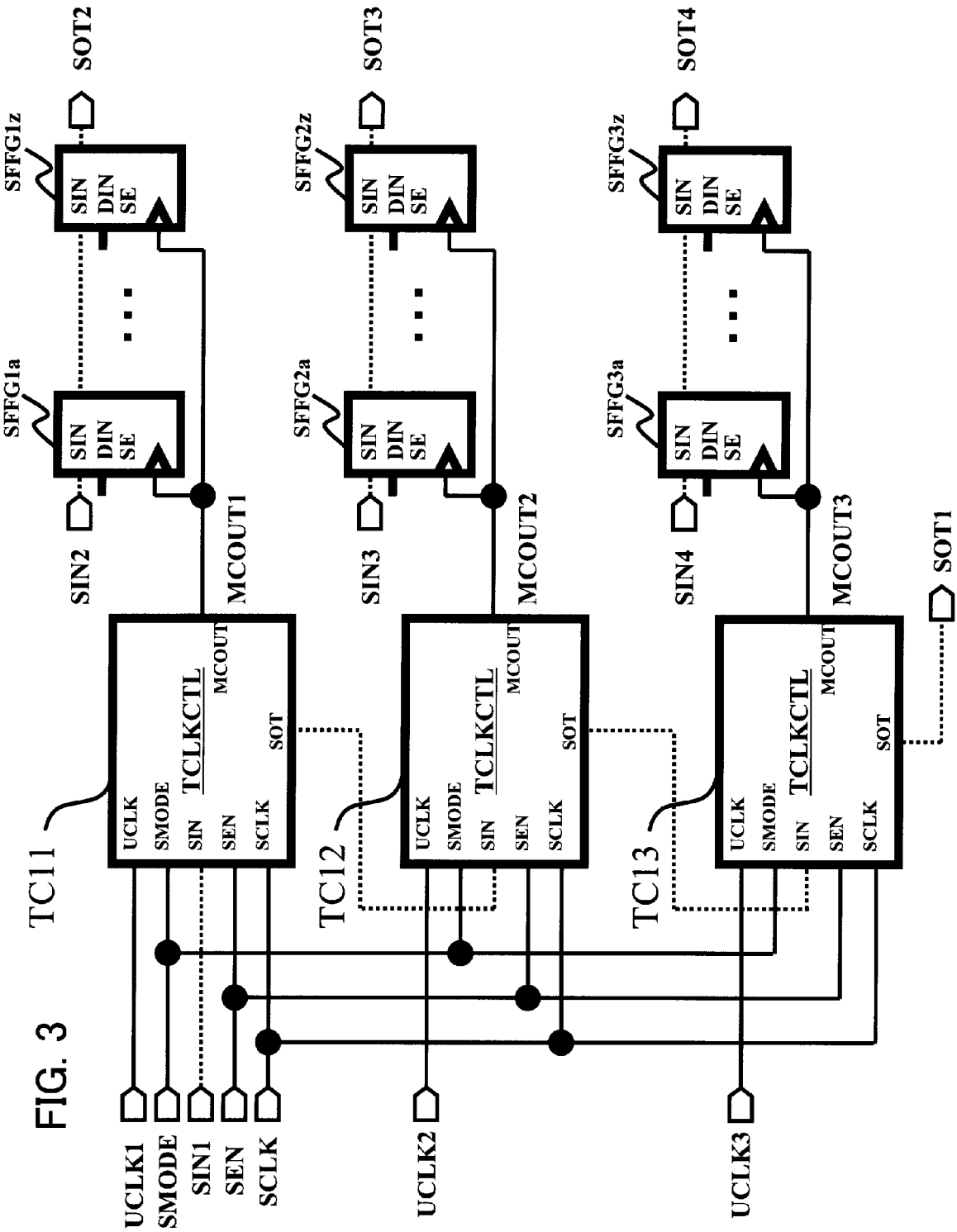
FIG. 3 is a diagram illustrating the configuration of a first example of the present invention.

The present invention will now be described in detail with reference to the accompanying drawings. The invention will be described with regard to a first example. FIG. 3 is a diagram illustrating the configuration of a semiconductor integrated circuit having a test clock control circuit (TCLKCTL) according to the present invention.

As shown in FIG. 3, a first test clock control circuit (TCLKCTL) TC11 is placed at a position at which it controls a first register group (a group of scan flip-flops) SFFG1a to SFFG1z that belong to a clock domain driven by a first clock UCLK1 when the user mode is in effect. The first register group SFFG1a to SFFG1z is connected to the same scan chain.

The first test clock control circuit TC11 receives as inputs the first user clock UCLK1, a scan mode signal SMODE, a scan input signal SIN1, a scan-enable signal SEN and a scan path test clock SCLK. The scan mode signal SMODE, which controls the mode of the scan path test, specifies the scan path test when at high level and the user mode when at low level. The scan input signal SIN1 is a serially received input signal for scan path test. The scan-enable signal SEN controls serial shift and scan capture (sampling of a data input terminal DIN in response to the clock signal) on a scan chain based upon the scan path test clock SCLK. The output of a scan flip-flop (SFF in FIG. 4) within the first test clock control circuit TC11 is output to SOT, and the clock after being controlled by the first test clock control circuit TC11 is output to an output terminal MCOUT.

As shown in FIG. 3, a second test clock control circuit (TCLKCTL) TC12, which has the same internal configuration as that of the first test clock control circuit (TCLKCTL) TC11, is inserted at a position at which it controls a second register group) SFFG2a to SFFG2z that belong to a clock domain driven by a second clock UCLK2 when the user mode is in effect. The second register group SFFG2a to SFFG2z is connected to the same scan chain. The second test clock control circuit TC12 receives as inputs the second user clock UCLK2, the scan mode signal SMODE, the scan output signal (SOT) of the first test clock control circuit TC11, the scan-enable signal SEN and the scan path test clock SCLK. Further, the output of a scan flip-flop within the second test clock control circuit TC12 is output to SOT, and the clock after being controlled by the second test clock control circuit TC12 is output to an output terminal MCOUT.

A third test clock control circuit (TCLKCTL) TC13, which has the same internal configuration as that of the first test clock control circuit (TCLKCTL) TC11, is inserted at a position at which it controls a third register group) SFFG3a to SFFG3z that belong to a clock domain driven by a third clock UCLK3 when the user mode is in effect. The third register group SFFG3a to SFFG3z is connected to the same scan chain. The third test clock control circuit TC13 receives as inputs the third user clock UCLK3, the scan mode signal SMODE, the scan output signal (SOT) of the second test clock control circuit TC12, the scan-enable signal SEN and the scan path test clock SCLK. Further, the output of a scan flip-flop within the third test clock control circuit TC13 is output to SOT, and the clock after being controlled by the third test clock control circuit TC13 is output to an output terminal MCOUT.

The first test clock control circuit TC11, second test clock control circuit TC12 and third test clock control circuit TC13 are connected to the same scan chain. That is, the scan output SOT of the first test clock control circuit TC1 is connected to the scan input SIN of the second test clock control circuit TC12, the scan output SOT of the second test clock control circuit TC12 is connected to the scan input SIN of the third test clock control circuit TC13, and the scan output SOT of the third test clock control circuit TC13 is connected to a scan output terminal SOT1. The scan output SOT is shifted in response to the scan path test clock SCLK and is output to the outside.

Figure 4:
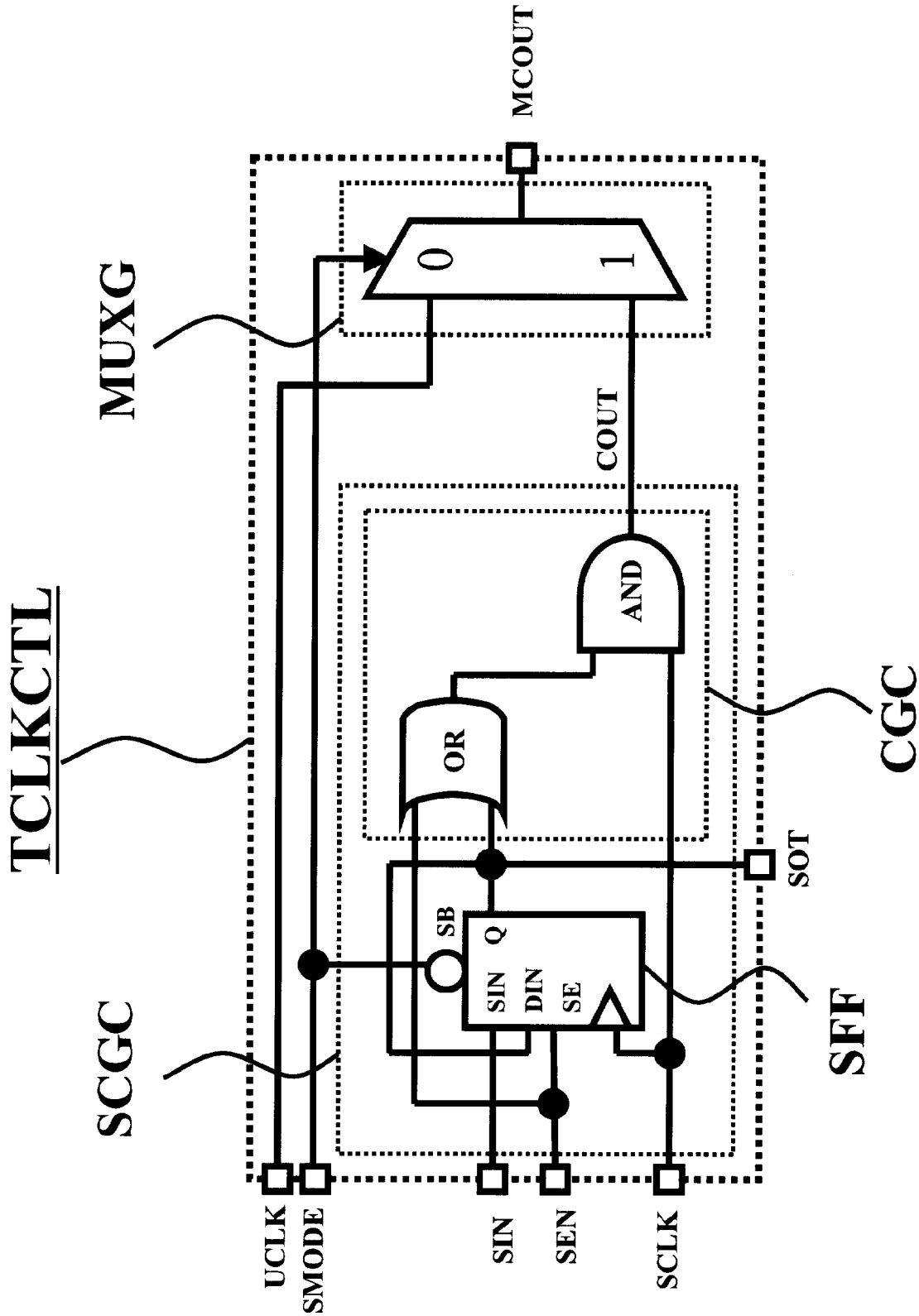
FIG. 4 is a diagram illustrating the configuration of a test clock control circuit according to the first example.

FIG. 4 is a diagram illustrating the detailed circuit configuration of the test clock control circuit (TCLKCTL) of FIG. 3. As shown in FIG. 4, an SCGC includes a scan flip-flop SFF whose output Q is set to logic "1" by placing the scan mode signal SMODE at low level when the user mode and not the scan path test mode is in effect, the scan flip-flop SFF being incorporated in the scan chain of the test clock control circuits TC11, TC12 and TC13 and being settable to any value; and a clock gating cell CGC for controlling whether to propagate or block the scan path test clock SCLK at the time of the scan path test depending upon the value of the scan-enable signal SEN and the value of the scan flip-flop SFF at the time of the scan path test. The scan flip-flop SFF is incorporated in the scan chain by having its chain input terminal SIN and output terminal Q connected to the chain input terminal SIN and scan output terminal SOT, respectively. Further, the output terminal Q is fed back and input to a data input terminal DIN.

The clock gating cell CGC includes an OR gate which receives the scan-enable signal SEN and output Q of the scan flip-flop SFF, and an AND gate which receives the output of the OR gate and the scan path test clock SCLK and outputs the result of the AND operation as clock signal COUT. The output terminal Q of the scan flip-flop SFF is connected to the scan output SOT of the test clock control circuit (TCLKCTL).

A clock selection circuit MUXG is a multiplexer which receives the scan mode signal SMODE as a selection control signal and selects the user clock UCLK when the scan mode signal SMODE is at low level, selects the clock signal COUT output under the control of the SCGC, when the scan mode signal SMODE is at high level, and outputs the selected signal as MCOUT.

Figure 5:
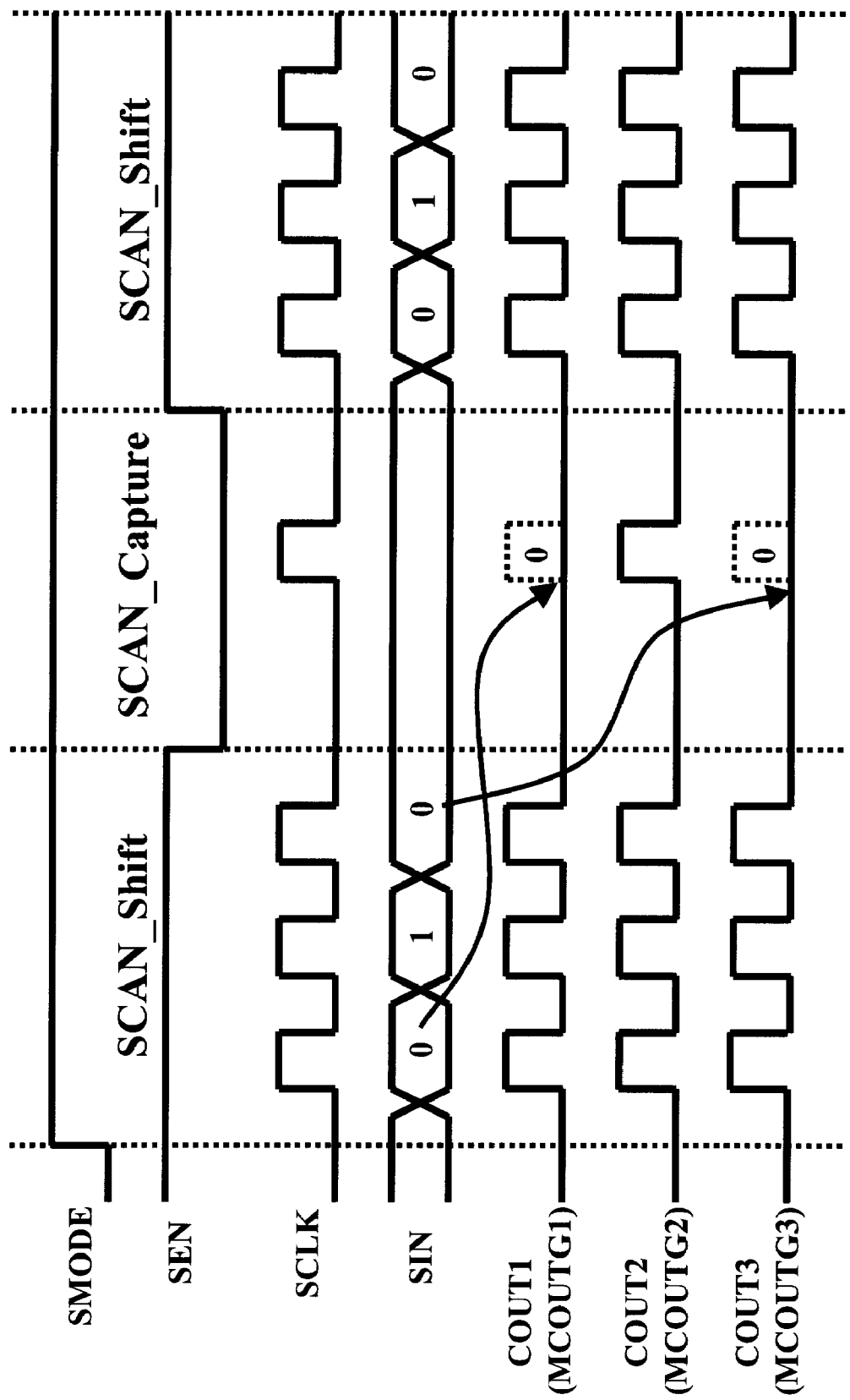
FIG. 5 is a timing chart illustrating the operation of the first example.

FIG. 5 is a diagram illustrating timing in the first example of the invention in a case where the scan path test is conducted solely with regard to the register group SFFG2a to SFFG2z driven by the clock output COUT2 of the second test clock control circuit TC12.

The scan mode signal SMODE indicating that the scan path test mode is in effect is fixed at high level, which is the active level.

The scan-enable signal SEN at time of the scan path test is placed at high level in the scan-shift interval and at low level in the scan-capture interval.

First, the scan-enable signal SEN is set to the high level to establish the scan-shift operational mode.

The test clock SCLK at the time of the scan path test is required to supply three clock pulses in order to shift the three scan flip-flops SFF (which construct the scan chain) disposed in the respective first, second and third first test clock control circuits TC11, TC12 and TC13.

In order to test only the clock domain driven by the output MCOUT2 of the second test clock control circuit TC12, the initial value "0" of the shift input is shifted into the scan flip-flop SFF1 within the first test clock control circuit TC11 from the scan input terminal SIN1 by the first clock pulse of the test clock SCLK in the scan-shift interval.

Next, at the same time that the second value "1" of the shift input is shifted into the scan flip-flop SFF within the first test clock control circuit TC11 by the second clock pulse of the scan path test clock SCLK, the value "0" that was shifted into the scan flip-flop SFF within the first test clock control circuit TC11 by the first clock pulse is shifted into the scan flip-flop SFF within the second test clock control circuit TC12.

Next, at the same time that the third value "0" of the shift input is shifted into the scan flip-flop SFF within the first test clock control circuit TC11 by the third clock pulse of the scan path test clock SCLK, the value "1" that was shifted into the scan flip-flop SFF within the first test clock control circuit TC11 by the second clock pulse is shifted into the scan flip-flop SFF within the second test clock control circuit TC12, and, at the same time, the value "0" that was shifted into the scan flip-flop SFF within the second test clock control circuit TC11 by the second clock pulse is shifted into the scan flip-flop SFF within the third test clock control circuit TC13.

Thus, by virtue of the shifting operation based upon the three clock pulses of the scan path test clock SCLK, the values "0", "1" and "0" are shifted as final shift values into the scan flip-flop SFF within the first test clock control circuit TC11, the scan flip-flop SFF within the second test clock control circuit TC12 and the scan flip-flop SFF with the third test clock control circuit TC13, respectively, these being the scan-shift values from the scan input signal SIN1. This operation is none other a scan-shift operation in a scan path test.

In this scan-shift operation, the three clock domains start undergoing the scan-shift operation simultaneously with regard to the respective register groups SFFG1a to SFFG1z, SFFG2a to SFFG2z, SFFG3a to SFFG3z, and scan-shift values are set for all registers constructing each of the scan chains.

It should be noted that the number of clock pulses necessary for the scan-shift operation regarding these register groups depends upon the number of stages in the register groups SFFG1a to SFFG1z, SFFG2a to SFFG2z and SFFG3a to SFFG3z on the scan chains configured in the respective clock domains, namely upon the number of scan flip-flops.

With "0", "1" and "0" having been shifted as the final values of the scan-shift operation into the scan flip-flops SFF within the first test clock control circuit TC11, second test clock control circuit TC12 and third test clock control circuit TC13 by the scan-shift operation, the scan-enable signal SEN is set at low level to make the changeover to the scan-capture operational mode.

At this time the value that has been shifted into the scan flip-flop SFF within the first test clock control circuit TC11 is "0" and the scan-enable signal SEN is at low level in the scan capture interval. Consequently, the output obtained by passage through the clock gating cell CGC within the first test clock control circuit TC11 is "0". Further, since the scan mode signal SMODE is high, the clock selection circuit MUXG within the first test clock control circuit TC11 selects and outputs the output COUT of the clock gating cell CGC. As a result, the clock output signal MCOUT of the first test clock control circuit TC11 is "0". That is, in the scan-capture interval, MCOUT1 is fixed at "0" and does not operate as a clock pulse. Accordingly, the result of the logic within the applicable clock domain by shift-in operation to the register group SFFG1a to SFFG1z in a scan-shift interval is not loaded into the register group SFFG1a to SFFG1z in the scan-capture interval Similarly, the value that has been shifted into the scan flip-flop SFF within the third test clock control circuit TC13 is "0" and the scan-enable signal SEN is at low level in the scan capture interval. Consequently, the output obtained by passage through the clock gating cell CGC within the third test clock control circuit TC13 is "0".

Further, since the scan mode signal SMODE is high, the clock selection circuit MUXG within the third test clock control circuit TC13 selects and outputs the output COUT of the clock gating cell CGC. As a result, the clock output signal MCOUT of the third test clock control circuit TC13 is "0". That is, MCOUT3 is "0" and does not operate as a clock pulse in the scan-capture interval. Accordingly, the result of the logic within the applicable clock domain by shift-in operation to the register group SFFG3a to SFFG3z in the scan-shift interval, is not loaded into the register group SFFG3a to SFFG3z in the scan capture interval.

On the other hand, the value that has been shifted into the scan flip-flop SFF within the second test clock control circuit TC12 is "1" and the scan-enable signal SEN is at low level in the capture interval. Consequently, in the second test clock control circuit TC12, the output of the OR gate in the clock gating cell CGC is high and a clock pulse of the test clock SCLK is output at the output COUT of the internal clock gating cell CGC (at the output of the AND gate).

Since the scan mode signal SMODE is high, the clock selection circuit MUXG within the second test clock control circuit TC12 selects and outputs the output COUT of the clock gating cell CGC. As a result, the clock output signal MCOUT2 of the second test clock control circuit TC12 is a clock pulse that is equivalent to the scan path test clock SCLK. That is, the scan path test clock SCLK supplied to the second test clock control circuit TC12 is output from the clock output terminal MCOUT2 of the second test clock control circuit TC12 via the logic gates AND and MUXG.

Accordingly, the result of the logic within the applicable clock domain by shift-in operation to the register group SFFG2a to SFFG2z, is loaded into the register group SFFG2a to SFFG2z by the clock output MCOUT2 from the second test clock control circuit TC12 in the scan-capture interval.

With reference again to FIG. 5, the scan-enable signal SEN is set to the high level at the conclusion of the capture operation, thereby setting the scan-shift mode again.

In the shift-scan mode, the values that have been stored in all of the respective registers SFFG1a to SFFG1z, SFFG2a to SFFG2z and SFFG3a to SFFG3z are shifted out from the respective scan output terminals SOT2, SOT3 and SOT4. Similarly, the values that have been stored in the scan flip-flops SFF within the respective first to third test clock control circuits TC11 to TC13 are output from the scan output terminal SOT1.

At this time the register group in which the result of activating the internal logic was loaded in the scan-capture interval is solely the group SFFG2a to SFFG2z, namely solely the clock domain that was driven by MCOUT2. Thus the scan path test has been conducted solely with regard to this clock domain.

It will suffice to so arrange it that in a case where only the clock domain that is driven by the output MCOUT1 of the first test clock control circuit TC11 is subjected to the scan path test, it will suffice to so arrange it that "1" is shifted into solely the scan flip-flop SFF within the first test clock control circuit TC11 by the final value of the scan shift in the above-described operation, and "0" is shifted into scan flip-flops SFF within the respective second and third test clock control circuits TC12 and TC13.

Similarly, it will suffice to so arrange it that in a case where only the clock domain that is driven by the output MCOUT1 of the third test clock control circuit TC13 is subjected to the scan path test, it will suffice to so arrange it that "1" is shifted into solely the scan flip-flop SFF within the third test clock control circuit TC13 by the final value of the scan shift in the above-described operation, and "0" is shifted into scan flip-flops SFF within the respective first and second test clock control circuits TC11 and TC12.

Thus, even if the number of clock terminals (SCLK) at the time of the scan path test is only one, only the desired clock domain can be subjected to the scan path test and it is easy to narrow down problems, e.g., easy to identify the location of a fault when a failure occurs in a specific clock domain.

Further, in the user mode, the scan mode signal SMODE is fixed at low level. Therefore, "1" becomes the value of the output Q of the scan flip-flops SFF within all of the respective test clock control circuits TC11, TC12 and TC13. In the user mode, the scan-enable signal SEN also is fixed at low level just as in the case of the scan mode signal SMODE. The scan path test clock SCLK also is fixed at low level and the clock pulse, therefore, is not supplied. The clock selection circuit MUXG of the first test clock control circuit TC11 selects the user clock UCLK1 and outputs this user clock from MCOUT1. The clock selection circuit MUXG of the second test clock control circuit TC12 selects the user clock UCLK2 and outputs this user clock from MCOUT2. The clock selection circuit MUXG of the third test clock control circuit TC13 selects the user clock UCLK3 and outputs this user clock from MCOUT3.

Thus the user clocks UCLK1, UCLK2 and UCLK3 are selected and output by the respective clock selection circuits MUXG as the clock output MCOUT1 of the first test clock control circuit TC11, the clock output MCOUT2 of the second test clock control circuit TC12 and the clock output MCOUT3 of the third test clock control circuit TC13. As a result, the outputs of the clock gating cells CGC have no effect upon operation in the user mode.

Thus, in the present example, a clock gating cell CGC is inserted into a test clock line that is provided for each of a plurality of user clocks, and a scan flip-flop SFF is connected to the relevant clock gating cell CGC in a structure in which the output of the relevant clock gating cell CGC is capable of being controlled. Furthermore, the relevant scan flip-flop SFF is chain-connected to other scan flip-flops on the scan chain.

The present example is such that in a case where only a specific user clock domain is subjected to the scan path test (e.g., MCOUT2), "1" is shifted into the scan flip-flop SFF within the test clock control circuit (e.g., TC12), which is controlling the user clock domain to undergo the scan path test, by the final value of the scan shift operation after the scan path test mode is set.

If the mode is changed over to the scan-capture mode under these conditions, a clock pulse of the scan path test is supplied only to a specific user clock domain to undergo the scan path test. In other words, the scan capture operation is carried out only with regard to this user clock domain. Accordingly, even in a case where the number of test clock terminals at the time of the scan path test cannot be made the same as the number of clock domains when the user mode is in effect (e.g., even if there is only a single scan path test clock), it is possible to perform the scan capture operation solely with regard to any clock domain. In other words, the scan path test can be carried out.

Further, even in a case where there are a plurality of clock domains to undergo the scan path test, it is possible to set "1" by the final value of the scan shift operation in the scan flip-flops SFF within the plurality of test clock control circuits. This means that a plurality of clock domains to undergo the scan path test can be controlled at will and the intended clock domain can be subjected to the scan path test without increasing the test circuitry.

Figure 6:
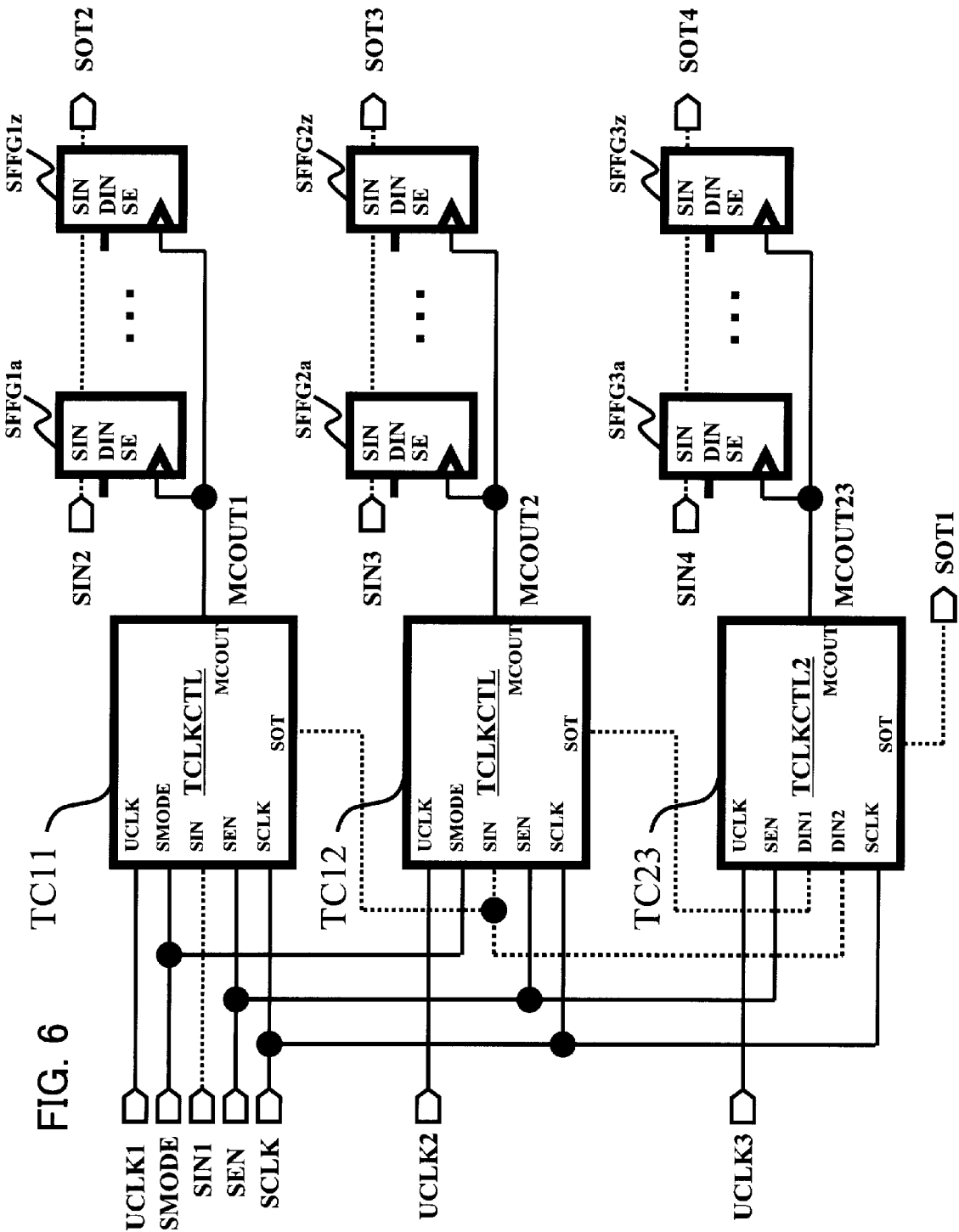
FIG. 6 is a diagram illustrating the configuration of a second example of the present invention.

The configuration of a second example of the invention will be described next. FIG. 6 is a diagram illustrating the configuration of the second example. As shown in FIG. 6, the first test clock control circuit TC11 and second test clock control circuit TC12 have the same configurations as those of the first example shown in FIG. 3. However, this example differs from the first example in the provision of a third test clock control circuit TC23.

The third test clock control circuit TC23 receives as inputs the third user clock UCLK3, the scan-enable signal SEN, the scan path test clock SCLK, the scan output signal from the first test clock control circuit TC11 at a terminal DIN2, and the scan output signal from the second test clock control circuit TC12 at a terminal DIN1. Further, the third test clock control circuit TC23 outputs the controlled clock from terminal MCOUT.

Figure 7:
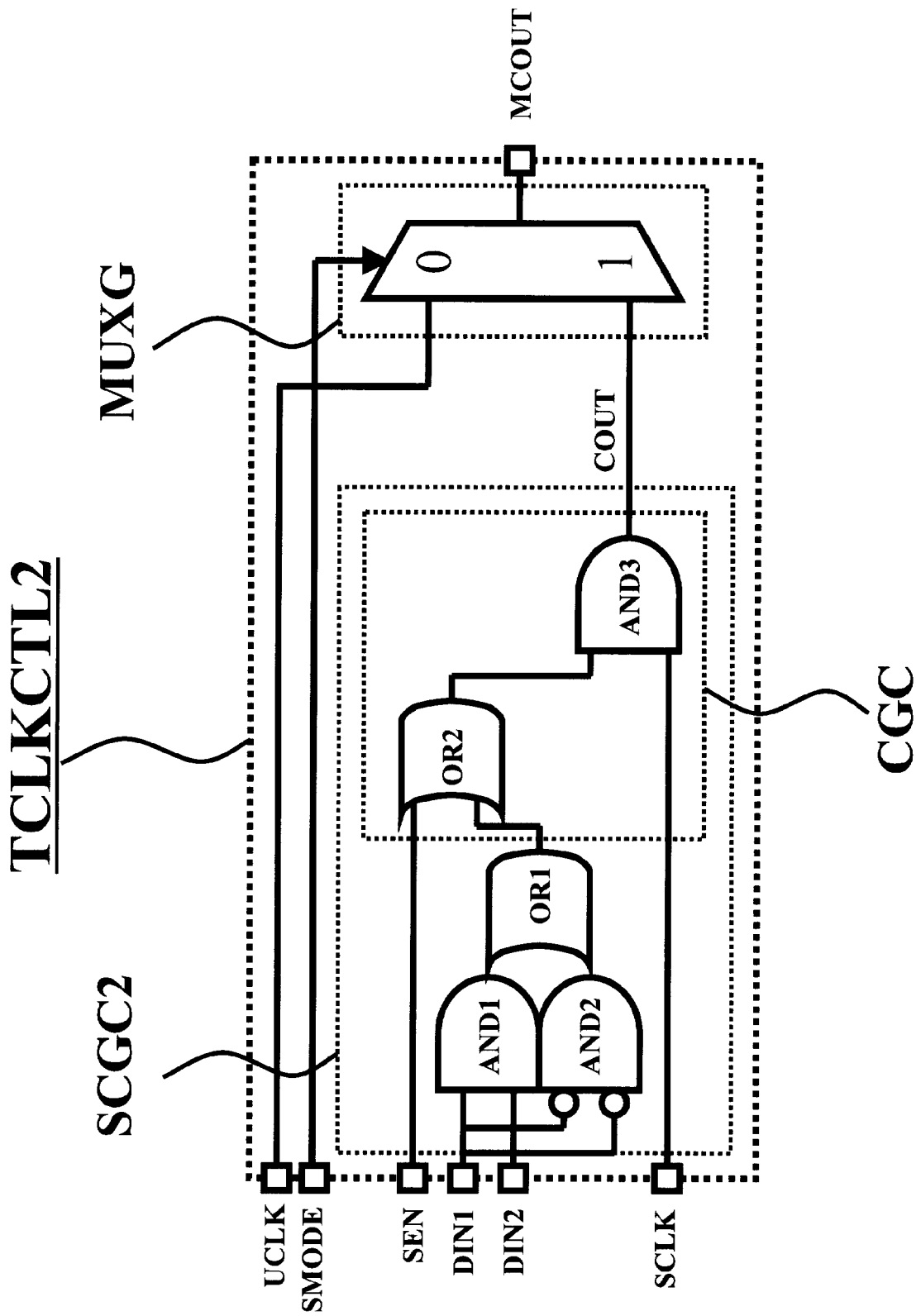
FIG. 7 is a diagram illustrating the configuration of a test clock control circuit according to the second example.

FIG. 7 is a diagram illustrating the detailed circuit configuration of the third test clock control circuit (TCLKCTL2) according to the second example of the invention shown in FIG. 6. As shown in FIG. 7, the third test clock control circuit (TCLKCTL2) has a clock gating cell SCGC2 for controlling whether to propagate or block the scan path test clock SCLK depending upon the values of two scan flip-flops which receive the output SOT of the scan flip-flop SFF provided in the first test clock control circuit TC11 and the output SOT of the scan flip-flop SFF provided in the first test clock control circuit TC12 from DIN2 and DIN1, respectively, as well as the value of the scan-enable signal SEN. More specifically, the clock gating cell SCGC2 includes an AND gate AND1 whose inputs are connected to DIN1 and DIN2; an AND gate AND2 which receives signals that are the inverse of the signals at DIN1 and DIN2; an OR gate OR1 which receives the outputs of the AND gates AND1 and AND2; an OR gate OR2 which receives the scan-enable signal SEN and the output of OR gate OR; and an AND gate AND3 which receives the output of the OR gate OR2 and the scan path test clock SCLK and outputs the result of the AND operation as COUT.

Figure 8:
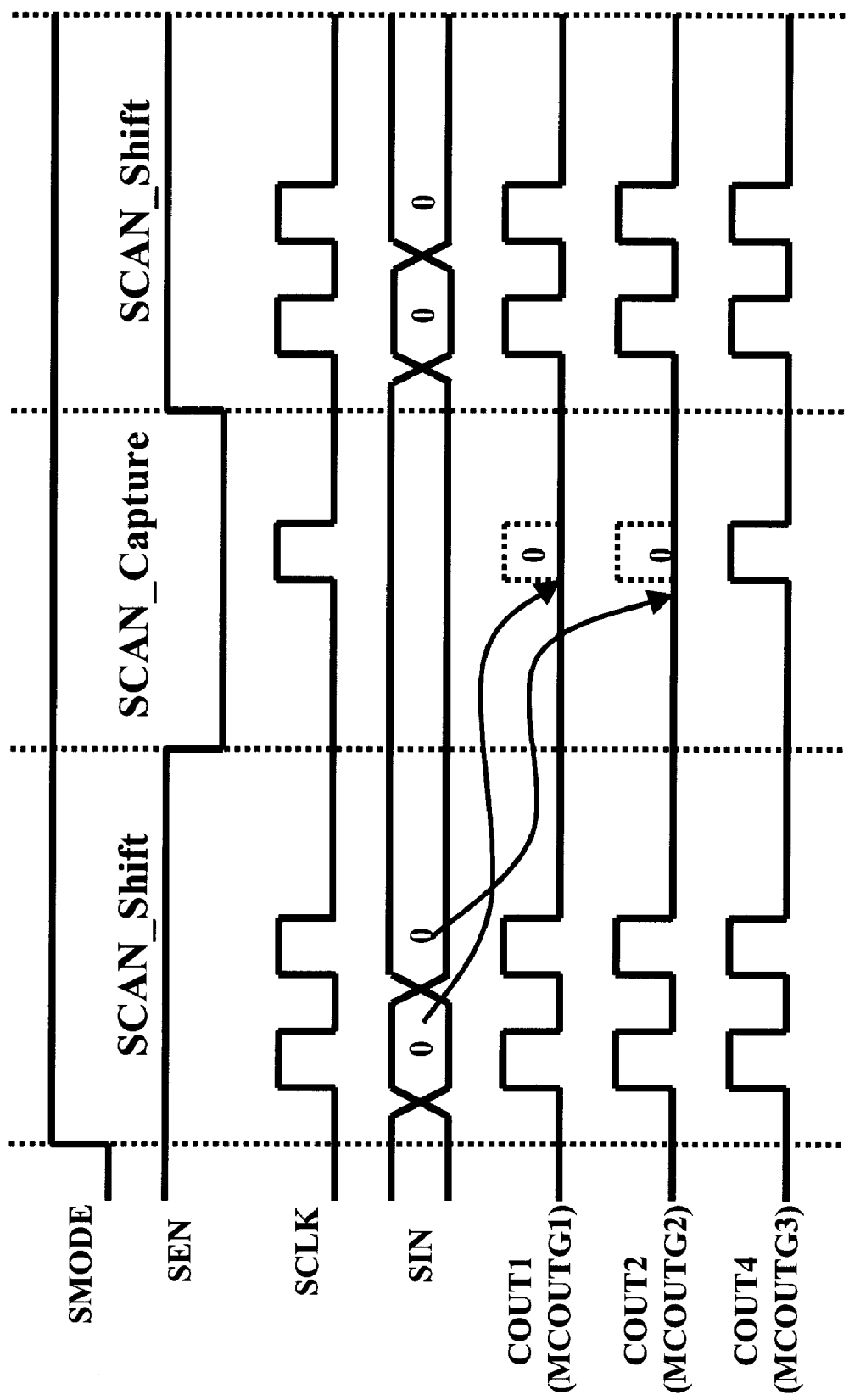
FIG. 8 is a timing chart illustrating the operation of the second example.

FIG. 8 is a timing chart illustrating operation of the circuit according to the second example of the present invention. This is a timing chart in a case where the scan path test is conducted solely with regard to the clock domain driven by the clock output COUT23 of the test clock control circuit TC23.

The scan-enable signal SEN at time of the scan path test is placed at high level in the scan-shift interval and at low level in the scan-capture interval.

The test clock SCLK at the time of the scan path test supplies two clock pulses in the scan-shift interval in order to shift two scan flip-flops SFF, namely the scan flip-flop SFF within the first test clock control circuit TC11 and the scan flip-flop SFF within the second test clock control circuit TC12 that construct the scan chain.

In order to test only the clock domain driven by the output MCOUT23 of the third test clock control circuit TC23, the initial value "0" of the shift input is shifted into the scan flip-flop SFF within the first test clock control circuit TC11 by the first clock pulse of the test clock SCLK in the scan-shift interval.

Next, at the same time that the second value "0" of the shift input is shifted into the scan flip-flop SFF within the second test clock control circuit TC12 by the second clock pulse of the test clock SCLK, the value "0" that was shifted into the scan flip-flop SFF within the first test clock control circuit TC11 by the first clock pulse is shifted into the scan flip-flop SFF within the second test clock control circuit TC12.

By supplying two clock pulses, "0" is shifted into the scan flip-flop SFF within the first test clock control circuit TC11 and into the scan flip-flop SFF within the second test clock control circuit TC12 as the final values of the scan shift.

Next, the scan-enable signal SEN is set at low level to make the changeover to the scan-capture interval.

Owing to the value "0" that has been shifted into the scan flip-flop SFF within the first test clock control circuit TC11 and the fact that the value of the scan-enable signal SEN is at low level, propagation of the scan path test clock SCLK is cut off. Accordingly, the output MCOUT1 of the first test clock control circuit TC11 in the scan-capture interval becomes "0".

The output MCOUT2 of the second test clock control circuit TC12 also becomes "1" as a result of similar operation.

On the other hand, in the third test clock control circuit TC23, the value "0" of the scan flip-flop within the first test clock control circuit TC11 and the value "0" of the scan flip-flop within the second test clock control circuit TC12 are supplied to the clock gating cell SCGC2. In the clock gating cell SCGC2, the output of the AND gate AND2 goes high, the outputs of the OR gates OR1 and OR2 go high and the scan path test clock SCLK is output from the output COUT of the AND gate AND3. Since SMODE is at high level, the clock selection circuit MUXG selects and outputs COUT. A clock pulse identical with that of the test clock SCLK is output to MCOUT 23.

It should be noted that according to the configuration of the third test clock control circuit TC23 of this example, it is possible for all of the clock domains driven by the clocks MCOUT1, MCOUT2 and MCOUT23 to be subjected to the scan path test simultaneously.

Accordingly, by shifting "1" as the final value of the scan shift into the scan flip-flop SFF within the first test clock control circuit TC11 and shifting "1" as the final value of the scan shift into the scan flip-flop SFF within the second test clock control circuit TC12, the output of the OR gate OR2 of the clock gating cell SCGC2 within the third test clock control circuit TC23 is made "1". In the clock gating cell SCGC2, the output of the AND gate AND3 goes high, the outputs of the OR gates OR1 and OR2 go high and SCLK is output from the output COUT of AND gate AND3. Since SMODE is at high level, the clock selection circuit MUXG selects and outputs COUT. A clock pulse identical with that of the test clock SCLK is output to MCOUT 23.

According to the second example, the scan path test can be executed solely with regard to a desired clock domain in a manner similar to that of the first example. An additional advantage is that the test clock control circuit can be made smaller in comparison with the arrangement in which scan flip-flops are incorporated in the first, second and third test clock control circuits.

Further, it is possible to control even more user clocks by configuring the logic gates of the clock gating cell SCGC within the third test clock control circuit TC23 of the second example as a multiple-input decoder circuit [e.g., a decoder in which the outputs of scan flip-flops of n (where n is equal to or greater than 3) test clock control circuits are input from D1 to Dn].

Figure 9:
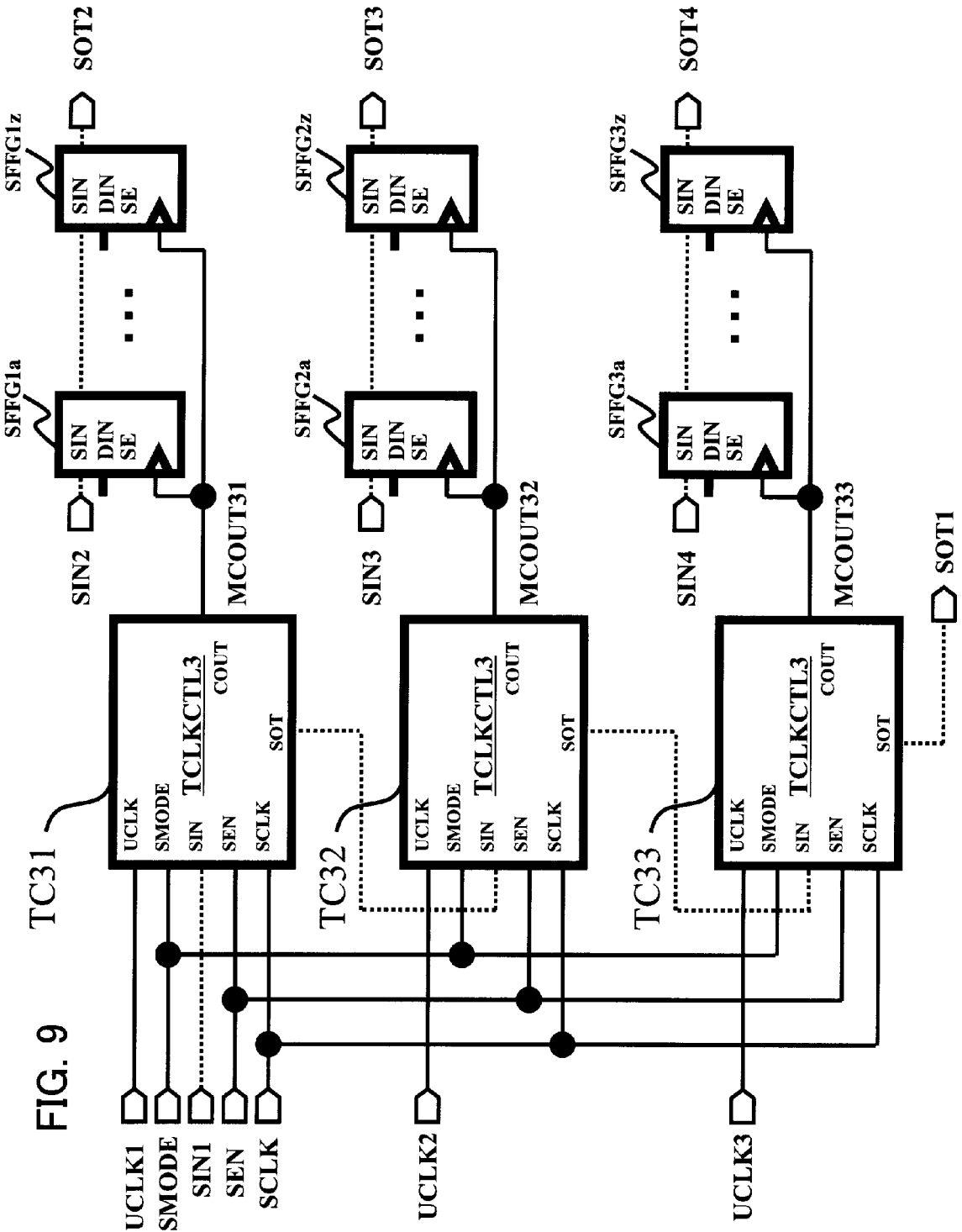
FIG. 9 is a diagram illustrating the configuration of a third example of the present invention.

FIG. 9 is a diagram illustrating the configuration of a third example according to the present invention. Although the connections of the test clock control circuits are the same in comparison with the first example, the configurations of the test clock control circuits (TCLKCTL3) TC31, TC32 and TC33 are different from those of the first example.

Figure 10:
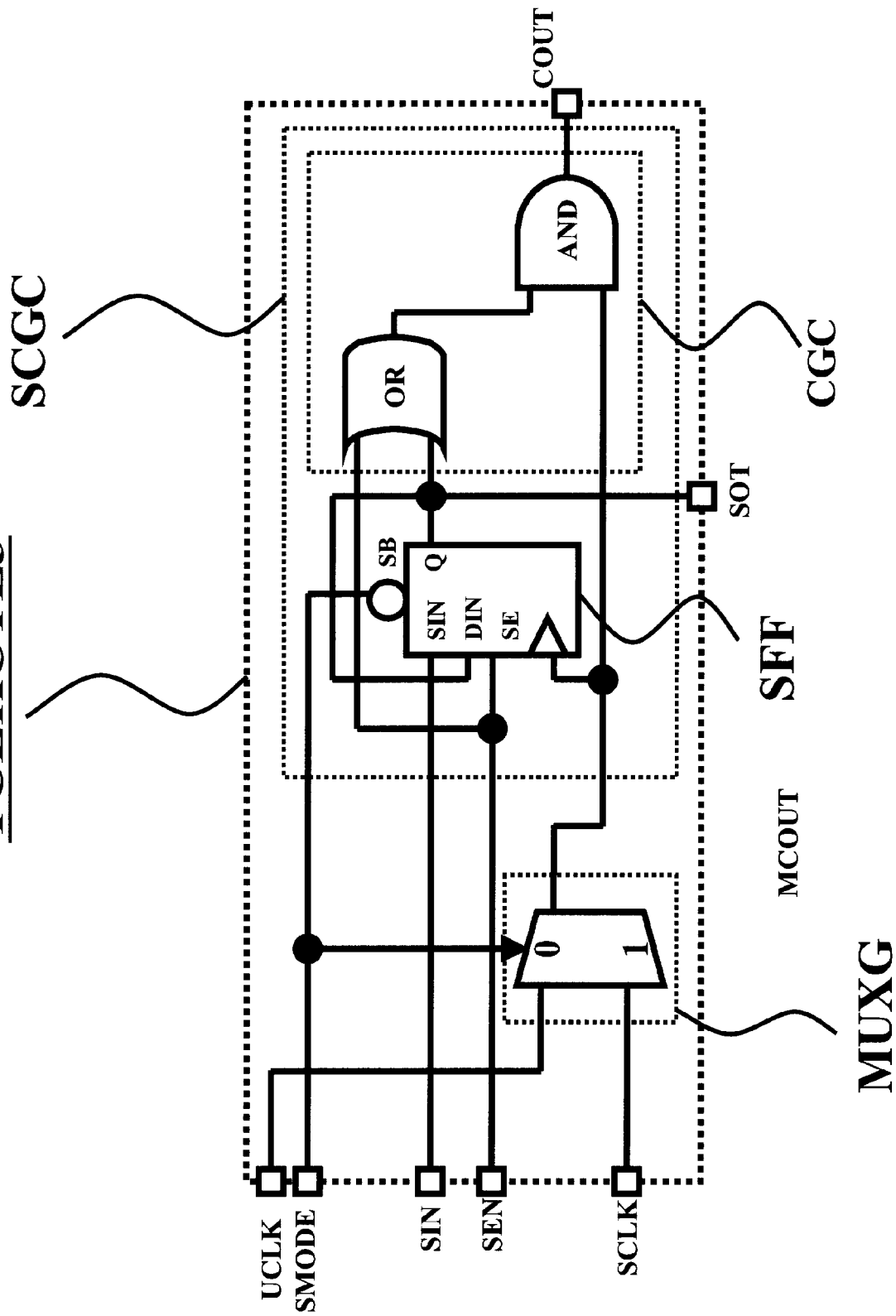
FIG. 10 is a diagram illustrating the configuration of a test clock control circuit according to the third example.

FIG. 10 is a diagram illustrating the detailed circuit configuration of the test clock control circuits TC31, TC32 and TC33 according to the third example.

In the test clock control circuit (TCLKCTL) according to the first example, the clock selection circuit MUXG is placed downstream of the clock gating SCGC. In this example, however, as illustrated in FIG. 10, it may be so arranged that the clock gating SCGC is placed downstream of the clock selection circuit MUXG. The operation of this example is identical with that of the first example and need not be described again.

Figure 11:
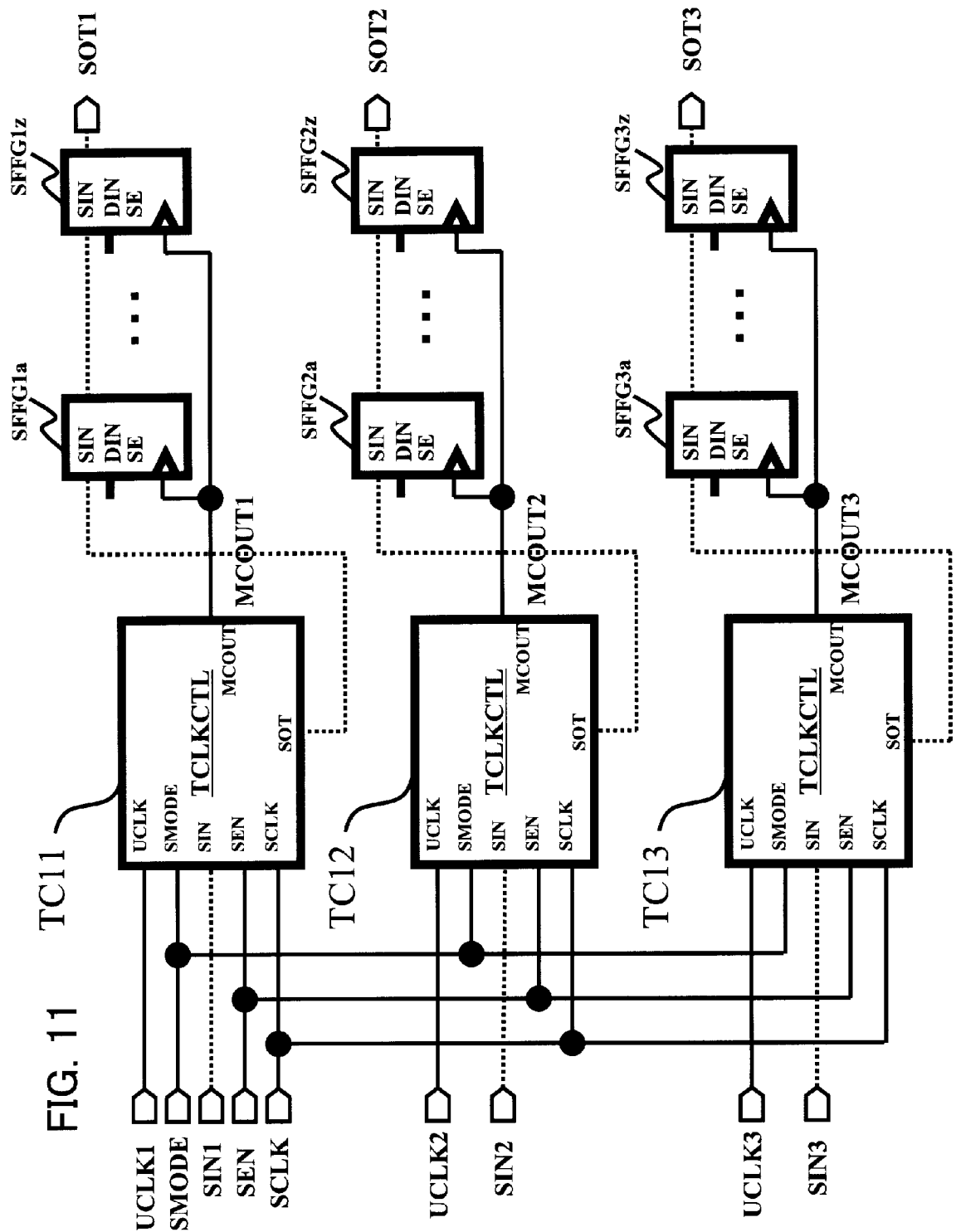
FIG. 11 is a diagram illustrating the configuration of a fourth example of the present invention.

FIG. 11 is a diagram illustrating the configuration of a fourth example according to the present invention. In this example, as shown in FIG. 11, the scan output SOT of the first test clock control circuit (TCLKCTL) TC11 is supplied to the serial input SIN of register (scan flip-flop) SFFG1a and constructs part of a scan chain together with the register group SFFG1a to SFFG1z. Similarly, with regard to the test clock control circuits (TCLKTL) TC12 and TC13, the scan outputs SOT are input to the serial inputs SIN of respective scan flip-flops SFFG2a and SFFG3a and construct parts of scan chains. That is, it is permissible to adopt a configuration in which the scan flip-flop SFF within a test clock control circuit (TCLKCTL) is incorporated as part of a scan chain for testing not only the scan flip-flops SFF within test clock control circuits but also other internal logic as well. It is permissible to adopt a configuration in which the data input terminal of the scan flip-flop SFF of test clock control circuit (TCLKCTL) TC11, instead of being feedback-connected to the data output terminal Q in the manner shown in FIG. 4, is connected to the corresponding output of an internal logic circuit (combinational circuit) in a manner similar to the data input terminals DIN of the register group SFFG1a to SFFG1z.

The present invention is such that even in a semiconductor integrated circuit of small size or limited number of test terminals in which terminals equivalent in number to the number of clock terminals in the user mode cannot be provided as test clock terminals for conducting a scan path test in the conventional art, a clock gating structure and a scan flip-flop that is capable of controlling the output value of the clock gating structure are inserted in a test clock line, and the scan flip-flop is incorporated in a scan chain, whereupon any value is set in the scan flip-flop by the final shift value of a scan shift, thereby making it possible to control whether to propagate or block a test clock at the time of scan capture. As a result, a scan path test can be conducted for each desired clock domain. Accordingly, it is easier to identify the location of a fault at the time of fault analysis when the fault occurs in a specific clock domain, and it is easier to test only a clock domain that operates at a specific clock rate.

In the configurations of the test clock control circuit (TCLKCTL) illustrated in FIGS. 4 and 10, use is made of the scan path test mode signal SMODE as the signal (the signal connected to the SB terminal of the scan flip-flop SFF) that sets the scan flip-flop SFF within the test clock control circuit (TCLKCTL) to an initial value. However, it goes without saying that the present invention is not limited solely to such an arrangement. For example, it may be so arranged that a prescribed test terminal (e.g., a terminal used at the time of a test) of the semiconductor integrated circuit different from that of the scan path test mode signal SMODE is assigned as a terminal for setting or resetting the scan flip-flop SFF, and the output of the scan flip-flop SFF within the test clock control circuit (TCLKCTL) is set to "1" on the basis of this signal.

Further, according to each of the examples illustrated in the respective FIGS. 3, 6, 9 and 11, the invention is described with regard to an example in which there is one terminal that receives the test clock SCLK at the time of the scan path test and three terminals that receive the user clocks UCLK1, UCLK2 and UCLK3. However, the single test clock terminal SCLK is exemplified as a concrete example in which the number of test clock terminals SCLK is reduced to the absolute minimum required in order to describe that a scan path test of every user clock domain can be conducted without it being necessary to provide a text clock terminal for every user clock domain; the number of test clock terminals naturally is not limited to one. That is, in the present invention, it will suffice if the test clock terminals are fewer in number than the user clock domains, and it is permissible to adopt an arrangement in which one additional separate test clock terminal is provided for receiving the test clock SCLK at the time of the scan path test. In accordance with the present invention, the scan path test of a plurality of user clock terminals can be conducted while the number of test clock terminals (pins) of a semiconductor integrated circuit is held to the minimum unit of one. As a result, effects such as a reduction in product cost and product failure (an increase in yield) owing to a reduction in the number of pins can be expected. Moreover, the number of terminals (pins) for supplying a test clock of an electronics card for test purposes can be reduced in tests by an LSI tester as well. This is effective in conducting a parallel test in which a plurality of DUTs (Devices Under Test) are tested simultaneously.

Though the present invention has been described in accordance with the foregoing examples, the invention is not limited to this example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
   a plurality of register groups;
   a plurality of test clock control circuits provided on a plurality of clock signal supply paths which are for supplying clock signals to the register groups, respectively; each test clock control circuit controlling whether to propagate or block a test clock signal on an associated one of the plurality of clock signal supply paths; and
   at least one test clock terminal for receiving at least one test clock signal, the number of which is less than the number of user clock domains;
   wherein at the time of a scan path test, a test clock signal from said test clock terminal is controlled by respective ones of said test clock control circuits on the plurality of clock signal supply paths, and a scan path test relating to each of the register groups respectively connected to the plurality of clock signal supply paths is conducted.

2. The device according to claim 1, wherein said test clock control circuit has a scan flip-flop and a clock gating circuit which controls whether a test clock pulse is propagated or blocked, based upon said scan flip-flop.

3. The device according to claim 2, wherein said scan flip-flop within said test clock control circuit is scan-chain connected with a scan flip-flop in another test clock control circuit.

4. The device according to claim 2, wherein said scan flip-flop within said test clock control circuit is scan-chain connected with another scan flip-flop on the corresponding clock signal supply path.

5. The device according to claim 2, wherein a value for controlling said clock gating circuit in the scan-capture interval is set in said scan flip-flop within said test clock control circuit by the final value of a scan-shift operation.

6. The device according to claim 2, wherein said clock gating circuit in said test clock control circuit is controlled by a logic gate which receives an output value from said scan flip-flop.

7. The device according to claim 2, wherein said test clock control circuit has a clock selection circuit provided downstream of said clock gating circuit;
   said clock selection circuit receiving as an input a control signal that controls the scan path test mode and the user mode, selecting and outputting the user clock signal when the control signal indicates the user mode and selecting, and outputting the test clock signal when the control signal indicates the scan path test mode;
   wherein the signal selected by said clock selection circuit is supplied to the corresponding clock signal supply path.

8. The device according to claim 2, wherein said test clock control circuit has a clock selection circuit provided upstream of said scan flip-flop;
   said clock selection circuit receiving as an input a control signal that controls the scan path test mode and the user mode, selecting the user clock signal when the control signal indicates the user mode, and selecting the test clock signal when the control signal indicates the scan path test mode.

9. The device according to claim 1, comprising:
   first to nth user clock terminals for receiving respective ones of a plurality (n) of user clock signals;
   a first control signal input terminal for receiving a first control signal which is for controlling a scan path test mode and a user mode;
   a second control signal input terminal for receiving a second control signal which is for controlling changeover between a scan-shift operational mode and a scan-capture operational mode;
   a scan input terminal;
   first to (n+1)th scan output terminals; and
   said test clock control circuits being composed by first to nth test clock control circuits connected between the respective first to nth user clock terminals and respective first to nth test clock supply paths leading to first to nth groups of scan flip-flops;
   wherein each test clock control circuit receives as inputs the first and second control signals, the test clock signal from said test clock terminal and the user clock signal from the corresponding user clock terminal, and includes:
   a scan flip-flop which, when the scan path test mode is in effect, and based upon the second control signal, samples and outputs serial data from said scan input terminal in response to the test clock signal in a scan-shift interval, and samples a signal at a data input terminal in response to the input test clock signal in a scan-capture interval;
   a clock gating circuit which controls transmission and non-transmission of the test clock signal based upon result of a logical operation between the output of said scan flip-flop and the second control signal; and
   a clock selection circuit which receives the first control signal as a selection control signal, selects the user clock signal when the first control signal indicates the user mode, and selects the output of said clock gating circuit when the first control signal indicates the scan path test mode;
   wherein outputs of the clock selection circuits of said first to nth test clock control circuits are supplied to respective first to nth test clock supply paths;
   a signal from said scan input terminal is supplied to said scan flip-flop in said first test clock control circuit;
   the scan flip-flop in an ith (where i is an integer equal to or greater than 2 and less than n) test clock control circuit is supplied with a signal from the scan output terminal of the scan flip-flop of the immediately preceding test clock control circuit;
   the output of the scan flip-flop in said nth test clock control circuit is connected to said first scan output terminal; and
   scan outputs of said first to nth groups of scan flip-flops are connected to said second to (n+1)th scan output terminals.

10. The device according to claim 9, wherein the output of the scan flip-flop in said test clock control circuit is connected to said scan output terminal of said test clock control circuit and to said clock gating circuit in said test clock control circuit and is fed back and input to the data input terminal of said scan flip-flop.

11. The device according to claim 9, wherein the scan flip-flop in said test clock control circuit is set to a prescribed value when the first control signal indicates the user mode.

12. The device according to claim 9, wherein a control signal for resetting or setting said scan flip-flop is received, and the scan flip-flops of said first to nth test clock control circuits are set to a prescribed value by the control signal for resetting or setting.

13. The device according to claims 9, wherein at least one output of the scan flip-flop of said nth test clock control circuit is scanned into the corresponding scan flip-flop group.

14. The device according to claim 9, wherein the number of said test clock terminals is less than the number of said user clock terminals.

15. The device according to claim 1, comprising:
first to nth user clock terminals for receiving respective ones of a plurality (n) of user clock signals;
a first control signal input terminal for receiving a first control signal which is for controlling a scan path test mode and a user mode;
a second control signal input terminal for receiving a second control signal which is for controlling changeover between a scan-shift operational mode and a scan-capture operational mode;
a scan input terminal;
first to (n+1)th scan output terminals; and
said test clock control circuits being composed by first to nth test clock control circuits connected between the respective first to nth user clock terminals and respective first to nth test clock supply paths leading to first to nth groups of scan flip-flops;
wherein each of said first to (n−1)th test clock control circuits receives as inputs the first and second control signals, the test clock signal from said test clock terminal and the user clock signal from the corresponding user clock terminal, and includes:
a scan flip-flop which, when the scan path test mode is in effect, and based upon the second control signal, samples and outputs serial data from said scan input terminal in response to the test clock signal in a scan-shift interval, and samples a signal at a data input terminal in response to the input test clock signal in a scan-capture interval;
a clock gating circuit which controls transmission and non-transmission of the test clock signal based upon result of a logical operation between the output of said scan flip-flop and the second control signal; and
a clock selection circuit which receives the first control signal as a selection control signal, selects the user clock signal when the first control signal indicates the user mode and selects the output of said clock gating circuit when the first control signal indicates the scan path test mode;
wherein said nth test clock control circuit receives as inputs the first and second control signals, the test clock signal from said test clock terminal and the user clock signal from the corresponding user clock terminal, and includes:
a decoder circuit which receives each of the outputs of the scan flip-flops of said first to (n−1)th test clock control circuits, and generates a signal, which conforms to a combination of the outputs of said scan flip-flops, in the scan-capture interval;
a clock gating circuit which controls transmission and non-transmission of the test clock signal based upon an output from said decoder circuit; and
a clock selection circuit which receives the first control signal as a selection signal, selects the user clock signal when the first control signal indicates the user mode and selects the output of said clock gating circuit when the first control signal indicates the scan path test mode;
wherein outputs of the clock selection circuits of said first to nth test clock control circuits are supplied to respective first to nth test clock supply paths;
a signal from said scan input terminal is supplied to said scan flip-flop in said first test clock control circuit;
the scan flip-flop in an ith (where i is an integer equal to or greater than 2 and less than n) test clock control circuit is supplied with a signal from the scan output terminal of the scan flip-flop of the immediately preceding test clock control circuit;
the output of the scan flip-flop in said nth test clock control circuit is connected to said first scan output terminal; and
scan outputs of said first to nth groups of scan flip-flops are connected to said second to (n+1)th scan output terminals.

16. The device according to claim 1, comprising:
first to nth user clock terminals for receiving respective ones of a plurality (n) of user clock signals;
a first control signal input terminal for receiving a first control signal for controlling a scan path test mode;
a second control signal input terminal for receiving a second control signal for controlling changeover between a scan-shift operational mode and a scan-capture operational mode;
a scan input terminal;
first to (n+1)th scan output terminals; and
said test clock control circuits being composed by first to nth test clock control circuits connected between the respective first to nth user clock terminals and respective first to nth test clock supply paths leading to first to nth groups of scan flip-flops;
wherein each test clock control circuits receives as inputs the first and second control signals, the test clock signal from said test clock terminal and the user clock signal from the corresponding user clock terminal, and includes:
a clock selection circuit which selects the user clock when the first control signal indicates the user mode, and selects the output of said clock gating circuit when the first control signal indicates the scan path test mode;
a scan flip-flop which, when the scan path test mode is in effect, and based upon the second control signal, samples and outputs serial data from said scan input terminal in response to the test clock signal in a scan-shift interval, and samples a signal at a data input terminal in response to the input test clock signal in a scan-capture interval; and
a clock gating circuit which controls transmission and non-transmission of the test clock signal output from said clock selection circuit, based upon result of a logical operation between the output of said scan flip-flop and the second control signal;
wherein outputs of the clock selection circuits of said first to nth test clock control circuits are supplied to respective first to nth test clock supply paths;
a signal from said scan input terminal is supplied to said scan flip-flop in said first test clock control circuit;
the scan flip-flop in an ith (where i is an integer equal to or greater than 2 and less than n) test clock control circuit is supplied with a signal from the scan output terminal of the scan flip-flop of the immediately preceding test clock control circuit;
the output of the scan flip-flop in said nth test clock control circuit is connected to said first scan output terminal; and
scan outputs of said first to nth groups of scan flip-flops are connected to said second to (n+1)th scan output terminals.

17. A semiconductor integrated circuit device comprising:
a plurality of sets each including a clock signal supply path and a register group comprising a plurality of scan flip-flops driven in common by a clock signal from the clock signal supply path; and
a plurality of test clock control circuits provided on said clock signal supply paths, respectively;

wherein when a user mode is in effect, each test clock control circuit allows a user clock signal, which is supplied from a corresponding user clock terminal, to propagate to the corresponding clock signal supply path;

when a scan path test mode is in effect, each test clock supply circuit, in a scan-shift interval, allows a test clock signal supplied from a common scan clock terminal to propagate to the corresponding clock signal supply path and scan-shifts a respective one of the plurality of sets of register groups;

in a scan-capture interval, a selected clock signal supply path is supplied with a test clock pulse from the corresponding test clock control circuit, a capture operation is performed selectively with respect to a register group connected to the selected clock signal supply path, and no test clock pulse is supplied to a non-selected clock signal supply path; and a scan path test relating to each register group on each of said plurality of clock signal supply paths is made executable with a number of test clock terminals smaller than the number of clock signal supply paths.

18. The device according to claim 17, wherein n-number of said test clock control circuits are provided in correspondence with the number (n) of user clock domains;

first to (n−1)th of said test clock control circuits each include a scan flip-flop and a clock gating circuit that controls whether a test clock pulse is propagated or blocked, based upon said scan flip-flop; and said nth test clock control circuit includes a clock gating circuit which receives outputs from said scan flip-flops of the first to (n−1)th of said test clock control circuits and controls, based upon a combination of values of the outputs, whether a test clock pulse is propagated or blocked.

19. A method of testing a semiconductor integrated circuit device having a plurality of sets, each including a clock signal supply path and a register group comprising a plurality of scan flip-flops driven in common by a clock signal from the clock signal supply path, the method comprising the steps of:

providing a test clock control circuit on each clock signal supply path;

when a scan path test mode is in effect, each test clock supply circuit, in a scan-shift interval, allowing a test clock signal supplied from a common scan clock terminal to propagate to the corresponding clock signal supply path and scan-shifting a respective one of the plurality of sets of register groups;

in a scan-capture interval, supplying a selected clock signal supply path with a test clock pulse from the corresponding test clock control circuit, performing a capture operation selectively with respect to a register group connected to the selected clock signal supply path, and supplying no test clock pulse to a non-selected clock signal supply path; and making executable a scan path test relating to each register group of the plurality of clock signal supply paths, with a number of test clock terminals smaller than the number of clock signal supply paths.

* * * * *